US011463098B2

United States Patent
Bal et al.

(10) Patent No.: US 11,463,098 B2
(45) Date of Patent: Oct. 4, 2022

(54) METHOD AND DEVICE FOR TESTING SUCCESSIVE APPROXIMATION REGISTER ANALOG-TO-DIGITAL CONVERTERS

(71) Applicant: STMICROELECTRONICS INTERNATIONAL N.V., Geneva (CH)

(72) Inventors: Ankur Bal, Greater Noida (IN); Sri Ram Gupta, Noida (IN); Rupesh Singh, Ghaziabad (IN)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 0 days.

(21) Appl. No.: 17/342,416

(22) Filed: Jun. 8, 2021

(65) Prior Publication Data

US 2022/0006467 A1    Jan. 6, 2022

Related U.S. Application Data

(60) Provisional application No. 63/047,759, filed on Jul. 2, 2020.

(51) Int. Cl.
*H03M 1/10*    (2006.01)
*H03M 1/38*    (2006.01)
*H03M 1/46*    (2006.01)

(52) U.S. Cl.
CPC .......... *H03M 1/1071* (2013.01); *H03M 1/38* (2013.01); *H03M 1/46* (2013.01)

(58) Field of Classification Search
CPC ......... H03M 1/1071; H03M 1/38; H03M 1/46
USPC ......................................... 341/120, 161, 163
See application file for complete search history.

(56) References Cited

U.S. PATENT DOCUMENTS

| | | | |
|---|---|---|---|
| 7,154,422 B2 * | 12/2006 | Wen ................... | H03M 1/1095 341/120 |
| 8,633,844 B2 | 1/2014 | Piasecki | |
| 9,209,824 B2 | 12/2015 | Shen et al. | |
| 9,800,255 B2 * | 10/2017 | Huang ................. | H03M 1/109 |
| 9,859,911 B1 | 1/2018 | Chen et al. | |
| 9,906,232 B1 | 2/2018 | Cho et al. | |
| 9,912,346 B1 | 3/2018 | Hamilton | |
| 9,923,569 B1 | 3/2018 | Chen et al. | |
| 10,211,844 B1 | 2/2019 | Molev-Shteiman et al. | |

\* cited by examiner

*Primary Examiner* — Khai M Nguyen

(74) *Attorney, Agent, or Firm* — Seed IP Law Group LLP

(57) ABSTRACT

An integrated circuit includes a successive approximation register (SAR) analog-to-digital converter (ADC). The ADC includes a bit step selector. During testing of the ADC, the bit step selector selects a number of bits to be tested for a next analog test voltage based on digital values that are within an integer delta value of most recent digital value for a most recent analog test voltage.

20 Claims, 6 Drawing Sheets

$\delta=4$

| | 4073 | 4077 | XOR 4073–4077 | | 4092 | 4096 | XOR 4092–4096 |
|---|---|---|---|---|---|---|---|
| $B_{12}$ | 0 | 0 | 0 | | 0 | 1 | 1 |
| $B_{11}$ | 1 | 1 | 0 | | 1 | 0 | 1 |
| $B_{10}$ | 1 | 1 | 0 | | 1 | 0 | 1 |
| $B_9$ | 1 | 1 | 0 | | 1 | 0 | 1 |
| $B_8$ | 1 | 1 | 0 | | 1 | 0 | 1 |
| $B_7$ | 1 | 1 | 0 | | 1 | 0 | 1 |
| $B_6$ | 1 | 1 | 0 | | 1 | 0 | 1 |
| $B_5$ | 1 | 1 | 0 | | 1 | 0 | 1 |
| $B_4$ | 0 | 0 | 0 | | 1 | 0 | 1 |
| $B_3$ | 1 | 1 | 0 | | 1 | 0 | 1 |
| $B_2$ | 0 | 1 | 1 | | 1 | 0 | 1 |
| $B_1$ | 0 | 0 | 0 | | 0 | 0 | 0 |
| $B_0$ | 1 | 1 | 0 | | 0 | 0 | 0 |

FIG. 3

$\delta = 4$

400

| | 4069 | 4073 | 4077 | XOR 4069-4077 | | 4088 | 4092 | 4096 | XOR 4088-4096 |
|---|---|---|---|---|---|---|---|---|---|
| $B_{12}$ | 0 | 0 | 0 | 0 | | 0 | 0 | 1 | 1 |
| $B_{11}$ | 1 | 1 | 1 | 0 | | 1 | 1 | 0 | 1 |
| $B_{10}$ | 1 | 1 | 1 | 0 | | 1 | 1 | 0 | 1 |
| $B_9$ | 1 | 1 | 1 | 0 | | 1 | 1 | 0 | 1 |
| $B_8$ | 1 | 1 | 1 | 0 | | 1 | 1 | 0 | 1 |
| $B_7$ | 1 | 1 | 1 | 0 | | 1 | 1 | 0 | 1 |
| $B_6$ | 1 | 1 | 1 | 0 | | 1 | 1 | 0 | 1 |
| $B_5$ | 1 | 1 | 1 | 0 | | 1 | 1 | 0 | 1 |
| $B_4$ | 0 | 0 | 0 | 0 | | 1 | 1 | 0 | 1 |
| $B_3$ | 0 | 1 | 1 | 1 | | 1 | 1 | 0 | 1 |
| $B_2$ | 1 | 0 | 1 | 0 | | 0 | 1 | 0 | 0 |
| $B_1$ | 0 | 0 | 0 | 0 | | 0 | 0 | 0 | 0 |
| $B_0$ | 1 | 1 | 1 | 0 | | 0 | 0 | 0 | 0 |

FIG. 4

METHOD AND DEVICE FOR TESTING SUCCESSIVE APPROXIMATION REGISTER ANALOG-TO-DIGITAL CONVERTERS

BACKGROUND

Technical Field

The present disclosure relates to the field of analog-to-digital converters. The present disclosure relates more particularly to testing analog-to-digital converters.

Description of the Related Art

Integrated circuits often include analog-to-digital converters. Analog-to-digital converters receive an analog voltage and output a digital value representative of the analog voltage. Typically, before an analog-to-digital converter is put into use, the analog-to-digital converter is tested for the expected range of input analog voltages. The testing process can help establish that the analog-to-digital converter will provide digital values for the entire range of input voltages.

BRIEF SUMMARY

In one embodiment of the present disclosure, a method includes testing an analog-to-digital converter with a plurality of monotonically increasing input test voltages in an input test voltage range. The method includes storing an integer value in a bit step selector of the analog-to-digital converter and identifying, with the analog-to-digital converter during testing, a first digital value corresponding to a most recent input test voltage. The method includes identifying a most significant bit that changes between the first digital value and a second digital value within the integer value from the first digital value. The method includes testing a next input test voltage in the input test voltage range by adjusting only those bits of the first digital value having a significance equal to or less than the most significant bit that changes between the first digital value and the second digital value.

In one embodiment, a method incudes testing a successive approximation analog-to-digital converter with monotonically increasing input test voltages from an input test voltage range. The method includes storing an integer value in a bit step selector of the analog-to-digital converter. The method includes identifying, with the bit step selector, a set of digital values to be tested for a next input test voltage based on a most significant bit that changes from a first digital value to a second digital value within the integer value of the first digital value. The first digital value corresponds to a most recent input test voltage. The method includes testing the next input test voltage by providing, from a successive approximation register of the analog-to-digital converter only the set of digital values.

In one embodiment, an integrated circuit includes an analog-to-digital converter. The analog-to-digital converter includes a successive approximation register configured to output digital values each including a plurality of bits. The analog-to-digital converter includes a digital-to-analog converter coupled to the successive approximation register and configured to receive the digital values and to generate analog output voltages representing the digital values. The analog-to-digital converter includes a comparator coupled to the digital-to-analog converter and configured to compare, during testing, the analog output voltages to analog test voltages. The analog-to-digital converter includes a bit step selector coupled to the successive approximation register and configured to store an integer value, to identify a most recent digital value corresponding to a most recent analog test voltage and to select a number of bits to be tested by the successive approximation register for a next analog test voltage based on a first digital value and a second a digital value within the integer value of the first digital value. The first digital value corresponds to a most recent analog test voltage.

BRIEF DESCRIPTION OF THE SEVERAL VIEWS OF THE DRAWINGS

FIG. 3 illustrates aspects of bit step selection for testing an analog-to-digital converter, according to one embodiment.

FIG. 4 illustrates aspects of bit step selection for testing an analog-to-digital converter, according to one embodiment.

DETAILED DESCRIPTION

Figure 1:
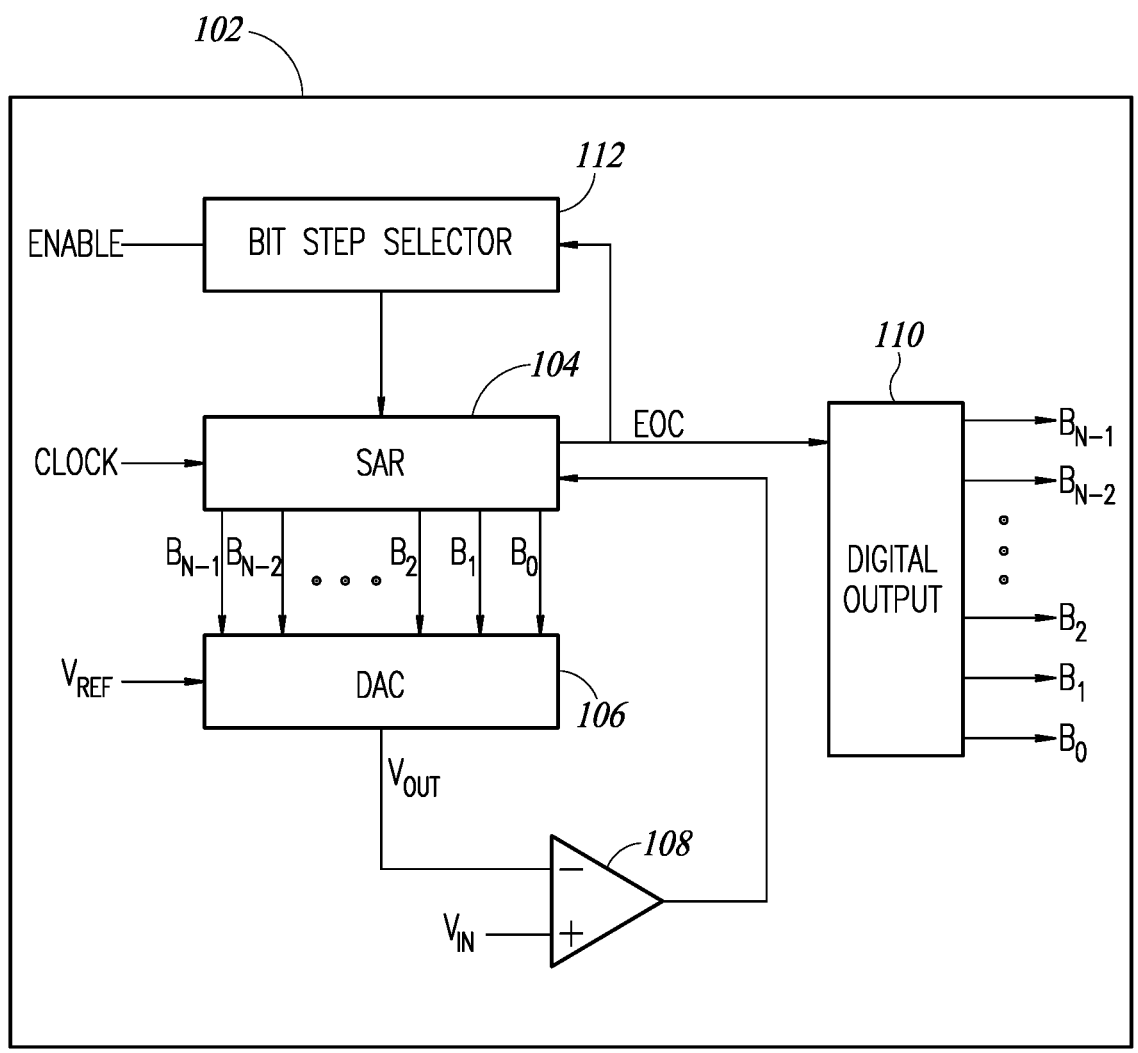
FIG. 1 is a block diagram of an integrated circuit including an analog-to-digital converter, according to one embodiment.

FIG. 1 is a block diagram of an integrated circuit 100, according to one embodiment. The integrated circuit 100 includes an analog-to-digital converter (ADC). The ADC 102 is configured to efficiently and effectively test itself before entering a standard operational mode. As is set forth in more detail below, the ADC 102 utilizes a testing process that reduces the number of bit tests to be performed during testing. The result is an analog-to-digital converter that takes less time and consumes fewer computing resources to complete testing prior to use.

In one embodiment, the ADC 102 includes a successive approximation register (SAR) 104, a digital-to-analog converter (DAC) 106, a comparator 108, a digital output 110, and a bit step selector 112. The components of the ADC 102 cooperate to convert input analog voltages to digital values during standard operation. During testing or initialization of the ADC 102, the components of the ADC 102 cooperate to test that the ADC 102 is able to provide digital values for an expected range of input voltages. In particular, as set forth more detail below, the bit step selector 112 facilitates testing the ADC 102 with a greatly reduced number of bit tests than traditional testing schemes. To facilitate understanding of the bit step selector 112, it is beneficial to first describe some of the details of other aspects of the ADC 102.

The ADC 102 is an N-bit ADC. For a given input voltage $V_{IN}$, the ADC 102 outputs a digital value having N bits. The number of bits N determines a resolution of the ADC 102. A higher number of bits results in a higher resolution in distinguishing between different input voltages. A lower number of bits results in a lower resolution in distinguishing between different input voltages. For example, if an expected input voltage range is 5 V, and the number of bits is one, then the resolution of the ADC 102 is 2.5 V. This means that each possible digital value covers a range of 2.5 V. A digital value of 0 can represent any voltage between 0

V and 2.5 V. A digital value of 1 can represent any voltage between 2.5 V and 5 V. If the number of bits is two, then the resolution of the ADC 102 is 1.25 V. This means that each possible digital value covers a range of 1.25 V. The digital value of 00 can represent any input voltage between 0 V and 1.25 V. The digital value 01 can represent any input voltage between 1.25 V and 2.5 V. The digital value 10 can represent any input voltage between 2.5 V and 3.75 V. The digital value 11 can represent any input voltage between 3.75 V and 5 V. Accordingly, as the number of bits increases, each digital output represents a smaller range of input values.

During standard operation, the SAR 104 outputs a series of digital values. The SAR 104 includes N binary outputs, labeled $B_{N-1}$-$B_0$. Each of the N outputs corresponds to a bit of a digital value that may represent an analog voltage. $B_{N-1}$ represents the most significant bit while $B_0$ represents the least significant bit. Operation of the SAR 104 is best understood in conjunction with the operation of the DAC 106 and the comparator 108.

The DAC 106 is coupled to the SAR 104 and to the comparator 108. The DAC 106 includes N inputs coupled to the N outputs of the SAR 104. Each input receives one of the binary values from the SAR 104. The DAC 106 includes an output coupled to an inverting terminal of the comparator 108. The DAC 106 outputs an analog voltage $V_{OUT}$ corresponding to the digital value represented by each of the N binary outputs from the SAR 104. The DAC 106 also receives a reference voltage $V_{REF}$. The reference voltage $V_{REF}$ may correspond to a maximum expected input voltage $V_{IN}$.

In one embodiment, during standard operation of the ADC 102, the SAR 104 outputs a sequence of digital values. For each digital value, the DAC 106 outputs the analog output voltage $V_{OUT}$. The comparator 108 receives, on its noninverting terminal, the input voltage $V_{IN}$. If $V_{IN}$ is greater than $V_{OUT}$, then the comparator outputs a high voltage value. If $V_{IN}$ is greater than $V_{OUT}$, then the comparator 108 outputs a low-voltage value. The output of the comparator 108 is coupled to an input of the SAR 104. The SAR 104 utilizes the output voltage $V_{OUT}$ to determine when the correct digital value has been output by the SAR 104. When the correct digital value has been output by the SAR 104, the SAR 104 causes an end of conversion signal (EOC) to go high. The SAR 104 also receives a clock signal that regulates operation of the SAR 104.

The digital output 110 includes N outputs each corresponding to one of the outputs of the SAR 104. Though not shown in FIG. 1, the digital output circuit 110 receives the digital values from the SAR 104. The digital output circuit 110 also receives the EOC signal from the SAR 104. When the EOC signal goes high, this indicates that the SAR 104 has output the correct digital value for the input voltage $V_{IN}$. The digital output circuit 110 latches its digital outputs to collectively provide the digital value identified by the SAR 104 as being the correct digital value representing the input voltage $V_{IN}$. The output of the digital output circuit 110 is the output of the ADC 102 representing the digital conversion of the analog input voltage $V_{IN}$.

In one embodiment, during standard operation, when a new input voltage $V_{IN}$ is received by the ADC 102, the SAR 104 outputs a series of N digital values. Each of the N digital value identifies the correct value of one of the bits. The first digital value determines the value of the most significant bit $B_{N-1}$. The second digital value determines the value of the second most significant bit $B_{N-2}$. The final digital value determines the value of the least most significant bit $B_0$. In the first digital value, the most significant bit $B_{N-1}$ is set to 1 and all remaining bits $B_{N-2}$-$B_0$ are set to 0. The DAC 106 generates an output voltage $V_{OUT}$ corresponding to this digital value. In practice, $V_{OUT}$ for this digital value may equal half of a reference voltage $V_{REF}$. If $V_{OUT}$ is greater than $V_{IN}$ for this digital value, then the comparator 108 will output a low voltage value and the SAR 104 will fix the most significant bit $B_{N-1}$ to 0. If $V_{OUT}$ is less than $V_{IN}$, then the comparator 108 will output a high-voltage value and the SAR 104 will fix the most significant bit $B_{N-1}$ to 1. The SAR 104 will output a second digital value in which $B_{N-1}$ has the value identified after testing the first digital value, $B_{N-2}$ is toggled to 1, and all remaining bits have a value of 0. If $V_{OUT}$ is greater than $V_{IN}$ for this second digital value, then the comparator 108 will output a low voltage value and the SAR 104 will fix $B_{N-2}$ to 0. If $V_{OUT}$ is less than $V_{IN}$, then the comparator 108 will output a high-voltage value and the SAR 104 will fix the bit $B_{N-2}$ to 1. The SAR 104 will then output a digital value for testing the next most significant bit, $B_{N-3}$. In the third digital value, $B_{N-1}$ and $B_{N-2}$ have the values identified after testing the first two digital values, $B_{N-3}$ is 1, and all remaining bits are 0. This testing process continues for each next most significant bit until the final digital value tests the least significant bit $B_0$.

After the value of the least significant bit $B_0$ has been identified, the SAR 104 causes EOC to go high. When EOC goes high, the digital output circuit 110 latches each of its digital outputs to the bit values identified via the sequence of digital values output by the SAR 104. Accordingly, the digital output circuit 110 outputs a digital value corresponding to the analog input voltage $V_{IN}$. While a particular process for identifying a correct digital value for an analog input voltage has been set forth above, other processes can be utilized without departing from the scope of the present disclosure.

Figure 2:
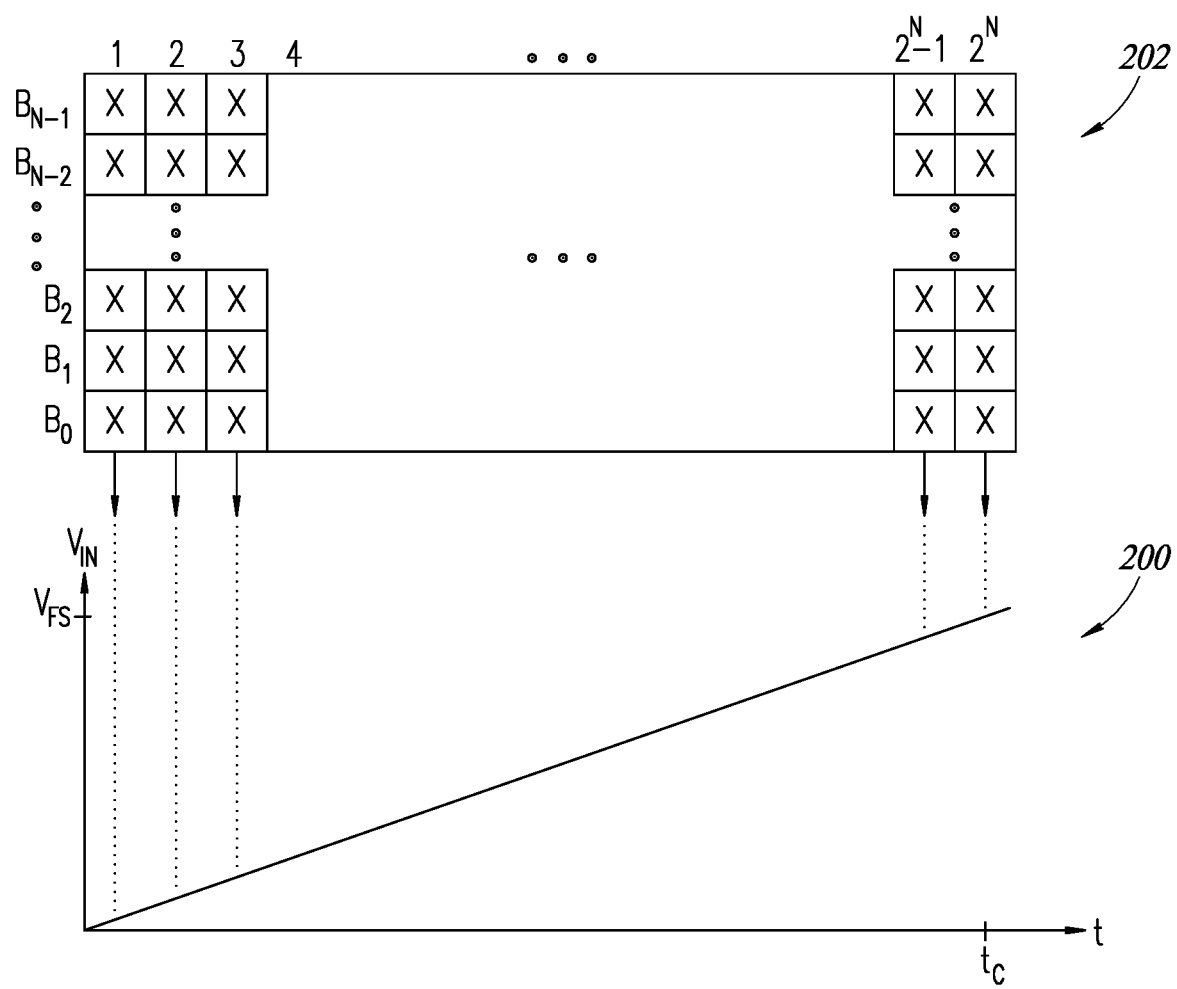
FIG. 2 illustrates a graph of a range of test voltages and corresponding digital values for the range of voltages, according to one embodiment.

As described previously, before the ADC 102 can be utilized in standard operation, the ADC 102 must be tested to assure that the ADC 102 can provide digital values across the entire range of expected input voltages. If the ADC 102 is not functioning properly, then it is possible that the ADC 102 may output digital values that do not properly correspond to the analog input voltages. For example, an improperly functioning ADC may output a first digital value for a first input voltage $V_{IN}$ and a second lower digital value for a second higher input voltage $V_{IN}$. Accordingly, testing the ADC 102 prior to implementation can ensure that the ADC 102 properly outputs digital values across the entire range of expected input voltages. FIG. 2 illustrates the digital values corresponding to the expected input range.

FIG. 2 illustrates a graph 200 of input test voltages and a table 202 of bit values, according to one embodiment. With reference to FIGS. 1 and 2, the graph 200 illustrates a monotonically increasing input test voltage versus time. The test voltage begins at 0 V and continues to the highest expected voltage VFs. While the graph 200 illustrates a smooth curve of test voltages versus time, in practice, the voltages may be increased in a stepwise manner.

Because the ADC 102 is an N bit ADC, there are $2^N$ possible digital values. The table 202 illustrates that each digital value corresponds to a particular test voltage. In practice, each input value may correspond to a small range of test voltages.

Traditional SAR ADCs are tested by providing a monotonically increasing range of test voltages from 0 V to an expected maximum voltage VFs. Accordingly, the traditional SAR ADCs will generate digital values for each of a series of monotonically increasing analog test voltages. Traditional SAR ADCs test each bit for each analog test voltage. For example, traditional SAR ADCs may test each input test voltage by generating N digital values to determine the value for each bit, as described above in relation to the standard operational mode of the ADC 102. Thus, there is a large number of digital values tested for each input test voltage.

Returning to FIG. 1, in one embodiment, the ADC 102 overcomes the drawbacks of traditional SAR ADCs by providing a testing process that tests a significantly lower number of digital values. The ADC 102 includes a bit step selector 112. The bit step selector is coupled to the SAR 104 and controls the number of digital values that will be tested by the SAR 104 for each input test voltage. The bit step selector 112 controls the SAR 104 in such a way that the SAR 104 tests a far smaller number of digital values during testing of the ADC 102 across the range of voltages tested.

In one embodiment, during testing, when the SAR 104 identifies the correct digital value for a test voltage, the bit step selector 112 utilizes this digital value to determine which digital values will be tested for a next test voltage. The bit step selector 112 utilizes the fact that test voltages increase monotonically during testing to reduce the number of overall digital values tested. In particular, because the test voltages increase monotonically, the bit step selector 112 can limit a range of digital values to be tested for a next test voltage based on the digital value for the most recent previous test voltage. In most cases, it is wasteful to test each bit for each test voltage. If the digital value for most recent test voltage is known, then the number of bits to test for the next test voltage can be selected based on the digital value for the most recent previous test voltage.

In one embodiment, the bit step selector 112 selects, or is provided with, a delta ($\delta$) value to be utilized during testing. The $\delta$ value may be interchangeably referred to herein as an integer value. The $\delta$ value is an integer less than the total number of bits of the ADC 102. The $\delta$ value indicates the number of adjacent digital values that will be used to determine the number of bits tested for the next test voltage.

In one embodiment, the bit step selector 112 identifies a digital value that is a $\delta$ value distance away from the digital value identified for the most recent test voltage. The bit step selector 112 compares the most recent digital value to the digital value that is the $\delta$ value distance away from the most recent digital value. The bit step selector 112 identifies the most significant bit that changes between the most recent digital value and the digital value that is the $\delta$ value distance away from the most recent digital value. The bit step selector 112 causes the SAR 104 to test digital values for the next test voltage by changing only those bits corresponding to the most significant bit that changed in the comparison and lower. In other words, all the bits that are more significant than the most significant bit that changed will be fixed to the values from the digital value that was found for the most recent test voltage. The result is that in most cases, far fewer digital values will be tested for each test voltage.

In one example, the ADC 102 is an 8 bit ADC. This means that there are 2^8, or 256, possible digital values. If each digital value is assigned a number, digital value 00000000 corresponds to the number 0, digital value 11111111 corresponds to the number 255. If a $\delta$ value of 4 is selected then for a most recent test voltage with a digital value corresponding 120, the number of bits to be tested for the next test voltage is based on a comparison of the digital value for 120 to the digital value for 124 (120+4). In particular, the number of bits to be tested for the next digital value is based on the most significant digit that changes between 120 and 124. The 8 bit binary digital value for the number 120 is 01111000. The eight bit binary digital value for the number 124 is 01111100. The most significant bit is the far left digit, and the least significant bit is the far right digit. In this case, the 5 most significant bits (01111) do not change between 120 and 124. The sixth bit (0 in 120 and 1 in 124) is the most significant bit that changes between the binary values for 120 and 124. Thus, the bit step selector 112 will specify that the five most significant bits from the previous digital value will not be changed when testing the next test voltage. Only the three least significant bits will be tested. This can be viewed as the bit step selector 112 effectively providing the value 01111XXX to the SAR 104 and telling the SAR 104 to determine the values of the three final bits XXX. Thus, rather than testing eight digital values for the next test voltage, the SAR 104 will only test three digital values.

In one embodiment, the bit step selector 112 identifies a first digital value that is a $\delta$ value beyond the digital value identified for the most recent test voltage and a digital value that is a $\delta$ value behind the most recent digital value. The bit step selector 112 compares the digital value that is the $\delta$ value behind to the digital value that is the $\delta$ value ahead of the digital value identified for the most recent test voltage. The bit step selector 112 identifies the most significant bit that changes between the digital value that is behind and the digital value that is the $\delta$ value ahead of the digital value for the most recent test value. The bit step selector 112 causes the SAR 104 to test digital values for the next test voltage by changing only those bits corresponding to the most significant bit that changed in the comparison and lower. In other words, all the bits that are more significant than the most significant bit that changed will be fixed to the values from the digital value that was found for the most recent test voltage.

In one example, the ADC 102 is an 8 bit ADC. If a $\delta$ value of 4 is selected, then for a most recent test voltage with a digital value corresponding 120, the number of bits to be tested for the next test voltage is based on a comparison of the digital value for 116 (120−4) to the digital value for 124 (120+4). In particular, the number of bits to be tested for the next digital value is based on the most significant digit that changes between the binary digital values for 116 and 124. The 8 bit binary digital value for the number 116 is 01110100. The eight bit binary digital value for the number 124 is 01111100. The most significant bit is the far left digit, and the least significant bit is the far right digit. In this case, the four most significant bits (0111) do not change between 116 and 124. The fifth bit (0 in 120 and 1 in 124) is the most significant bit that changes between the binary values for 116 and 124. Thus, the bit step selector 112 will specify that the four most significant bits from the previous digital value will not be changed when testing the next test voltage. Only the four least significant bits will be tested. This can be viewed as the bit step selector 112 effectively providing the value 0111XXXX to the SAR 104 and telling the SAR 104 to determine the values of the three final bits XYZ. Thus, rather than testing eight digital values for the next test voltage, the SAR 104 will only test three digital values.

In one embodiment, the bit step selector 112 includes an exclusive OR (XOR) logical operator. The bit step selector 112 performs the comparisons described above by performing an XOR operation on two digital values. The bit step selector 112 identifies the most significant bit that changes based on the XOR operation. For example, if the bit step selector 112 compares digital values that are the $\delta$ value behind and the $\delta$ value ahead of the most recent digital value, then the bit step selector 112 provides these two values to the XOR operator. The XOR operator performs an XOR operation on the two digital values. If the bit step selector 112 compares the most recent digital value to a digital value that is the δ value ahead, then the bit step selector 112 provides these two values to the XOR operator. The XOR operator performs an XOR operation on the two digital values. The bit step selector 112 can utilize other logical operations or comparisons than an XOR operation to determine which bits will be tested by the SAR 104, without departing from the scope of the present disclosure.

The δ value can be selected based on desired performance. Smaller δ values will result in faster testing processes. This is because smaller δ values will result in fewer digital values being tested throughout the testing process. Accordingly, various δ values can be selected without departing from the scope of the present disclosure.

In one embodiment, the bit step selector 112 receives the δ value from a circuit external to the bit step selector 112. For example, another circuit component of the integrated circuit 100, or a circuit external to the integrated circuit 100 can provide the δ value to the bit step selector 112. The bit step selector 112 can then test the ADC 102 based on the δ value provided. In this case, the bit step selector 112 can store the δ value in a memory that can be overwritten in the future if a new δ value is selected.

FIG. 3 illustrates a portion of a table 300 of digital values for an ADC 102, according to one embodiment. In the example of FIG. 3, the ADC 102 is a 13 bit ADC. The bits are labeled $B_0$-$B_{12}$. $B_{12}$ is the most significant bit. $B_0$ is the least significant bit. In a 13 bit ADC there are 8192 possible digital values. FIG. 3 illustrates an instance in which a digital value for a most recent test voltage is 4073 (0111111101001 in binary) and an example in which a digital value for a most recent test voltage is 4092 (0111111111100 in binary). In these examples, the δ value is 4. However, other δ values can be selected without departing from the scope of the present disclosure.

For the digital value 4073 and the δ value of 4, 4077 is the δ value ahead of 4073. 4077 is represented in binary as 0111111101001. To select the range of digital values that will be tested for the next test voltage, the bit step selector 112 identifies the most recent digital value (4073) and the digital value that is a δ value ahead of the most recent digital value (4077). The bit step selector 112 performs an XOR operation on the binary values for 4073 and 4077. For any bits that are the same between the two values, the XOR operation will return a 0. For any bits that are different between the two digital values, the XOR operation will return a 1. The bit step selector 112 identifies the most significant bit that is different between the two digital values. The bit step selector 112 then causes the SAR 104 to retain the values from the previous digital value for any bits more significant than the most significant bit that changed and to only test the bits with a significance less than or equal to the most significant bit that changed in the XOR operation. In this case, bit $B_2$ is the most significant bit that changed. Accordingly, for the next test voltage, the bit step selector 112 will force the SAR 104 to test only bits $B_2$, $B_1$, and $B_0$ rather than all 13 bits.

For the digital value 4092 and the δ value of 4, 4096 is the δ value ahead of 4092. 4096 is represented in binary as (1000000000000). To select the range of digital values that will be tested for the next test voltage, the bit step selector 112 identifies the most recent digital value (4092) and the digital value that is a δ value ahead of the most recent digital value (4096). The bit step selector 112 performs an XOR operation on the binary values for 4092 and 4096. In this case, bit $B_{12}$ is the most significant bit that changed. Accordingly, for the next test voltage, the bit step selector 112 will force the SAR 104 to test bits $B_{12}$-$B_0$, all of the bits. The reason that the bit step selector 112 will cause the SAR 104 to test all bits in this location, is because value 4096 is halfway between 0 and the maximum value of 8192. It is the value for which the most significant bit ($B_{12}$) changes from 0 to 1. Accordingly, for a very small number of digital values within the δ value of 4096, all bits will be tested. However, this still represents a vast improvement over the traditional SAR ADCs that test all bits for all test voltages.

FIG. 4 illustrates a table 400 of digital values for an ADC 102, according to one embodiment. In the example of FIG. 4, the ADC 102 is a 13 bit ADC. The bits are labeled $B_0$-$B_{12}$. $B_{12}$ is the most significant bit. $B_0$ is the least significant bit. In a 13 bit ADC there are 8192 possible digital values. FIG. 4 illustrates an instance in which a digital value for a most recent test voltage is 4073 (0111111101001 in binary) and an example in which a digital value for a most recent test voltage is 4092. In these examples, the δ value is 4.

For the digital value 4073 and the δ value of 4, 4077 is the δ value ahead of 4073 and 4069 is the δ value behind 4073. 4077 is represented in binary as 0111111101001. 4069 is represented in binary as 0111111100101. To select the range of digital values that will be tested for the next test voltage, the bit step selector 112 identifies the most recent digital value (4073) and the digital value that is a δ value ahead of the most recent digital value (4077) and the δ value behind the most recent digital value (4069). The bit step selector 112 performs an XOR operation on the binary values for 4069 and 4077. For any bits that are the same between the two values, the XOR operation will return a 0. For any bits that are different between the two digital values, the XOR operation will return a 1. The bit step selector 112 identifies the most significant bit that is different between the two digital values. The bit step selector 112 then causes the SAR 104 to retain the values from the previous digital value for any bits more significant than the most significant bit that changed and to only test the bits with a significance less than or equal to the most significant bit that changed in the XOR operation. In this case, bit $B_3$ is the most significant bit that changed. Accordingly, for the next test voltage, the bit step selector 112 will force the SAR 104 to test only bits $B_3$-$B_0$.

For the digital value 4092 and the δ value of 4, 4096 is the δ value ahead of 4092 and 4088 is the δ value behind 4092. 4096 is represented in binary as 1000000000000. 4088 is represented in binary as 0111111111000. To select the range of digital values that will be tested for the next test voltage, the bit step selector 112 identifies the most recent digital value (4092) and the digital value that is a δ value ahead of the most recent digital value (4096) and the δ value behind (4088). The bit step selector 112 performs an XOR operation on the binary values for 4088 and 4096. In this case, bit $B_{12}$ is the most significant bit that changed. Accordingly, for the next test voltage, the bit step selector 112 will force the SAR 104 to test bits $B_{12}$-$B_0$, all of the bits.

Figure 5:
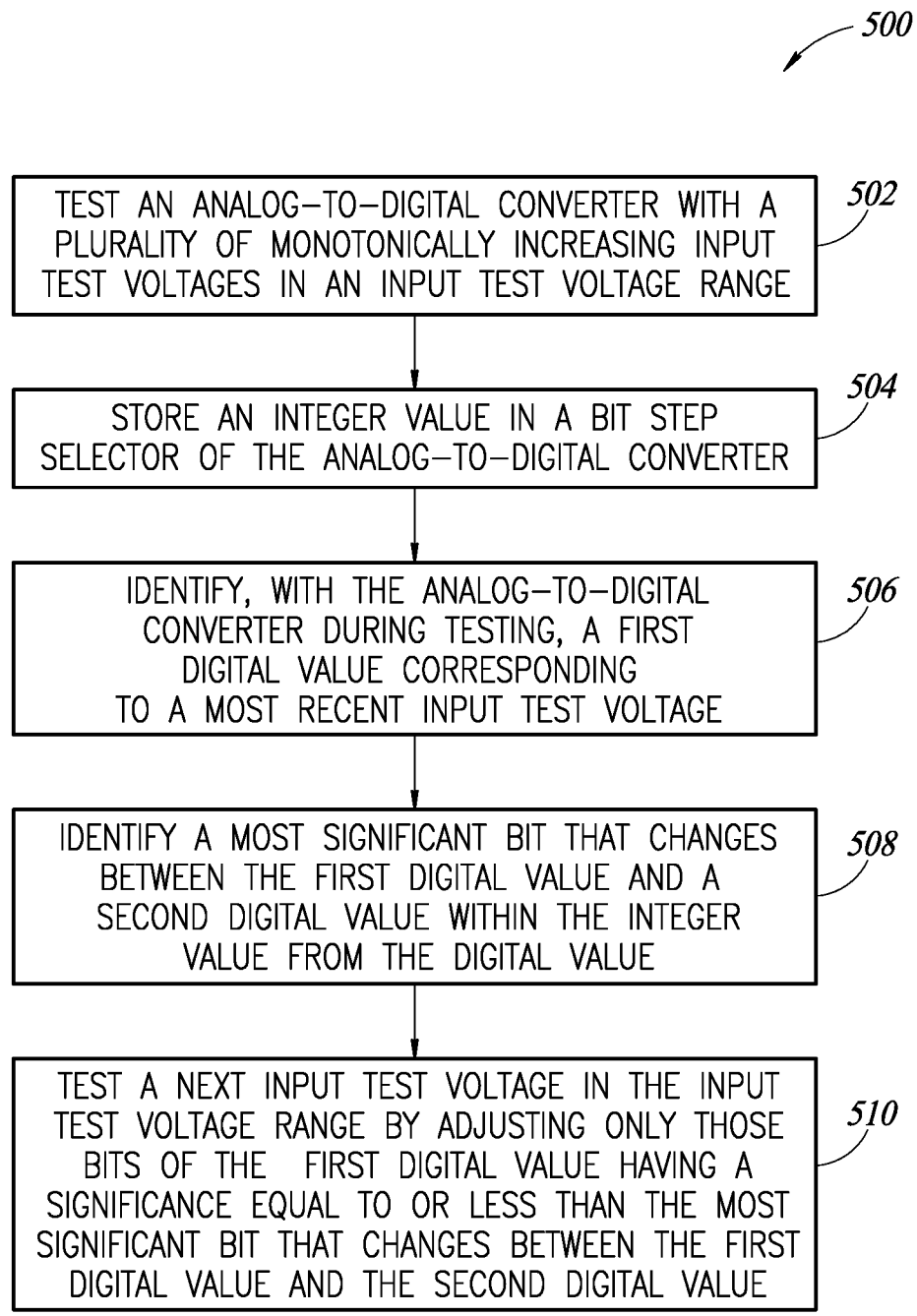
FIG. 5 is a flow diagram of a process for testing an analog-to-digital converter, according to one embodiment.

FIG. 5 is a flowchart of a method for testing an ADC, according to one embodiment. At 502, 500 includes testing an analog-to-digital converter with a plurality of monotonically increasing input test voltages in an input test voltage range. At 504, the method 500 includes storing an integer value in a bit step selector of the analog-to-digital converter. At 506, the method 500 includes identifying, with the analog-to-digital converter during testing, a first digital value corresponding to a most recent input test voltage. At 508, the method 500 includes identifying a most significant bit that changes between the first digital value and a second digital value within the integer value from the first digital value. At 510, the method 500 includes testing a next input test voltage in the input test voltage range by adjusting only those bits of the first digital value having a significance equal to or less than the most significant bit that changes between the first digital value and the second digital value.

Figure 6:
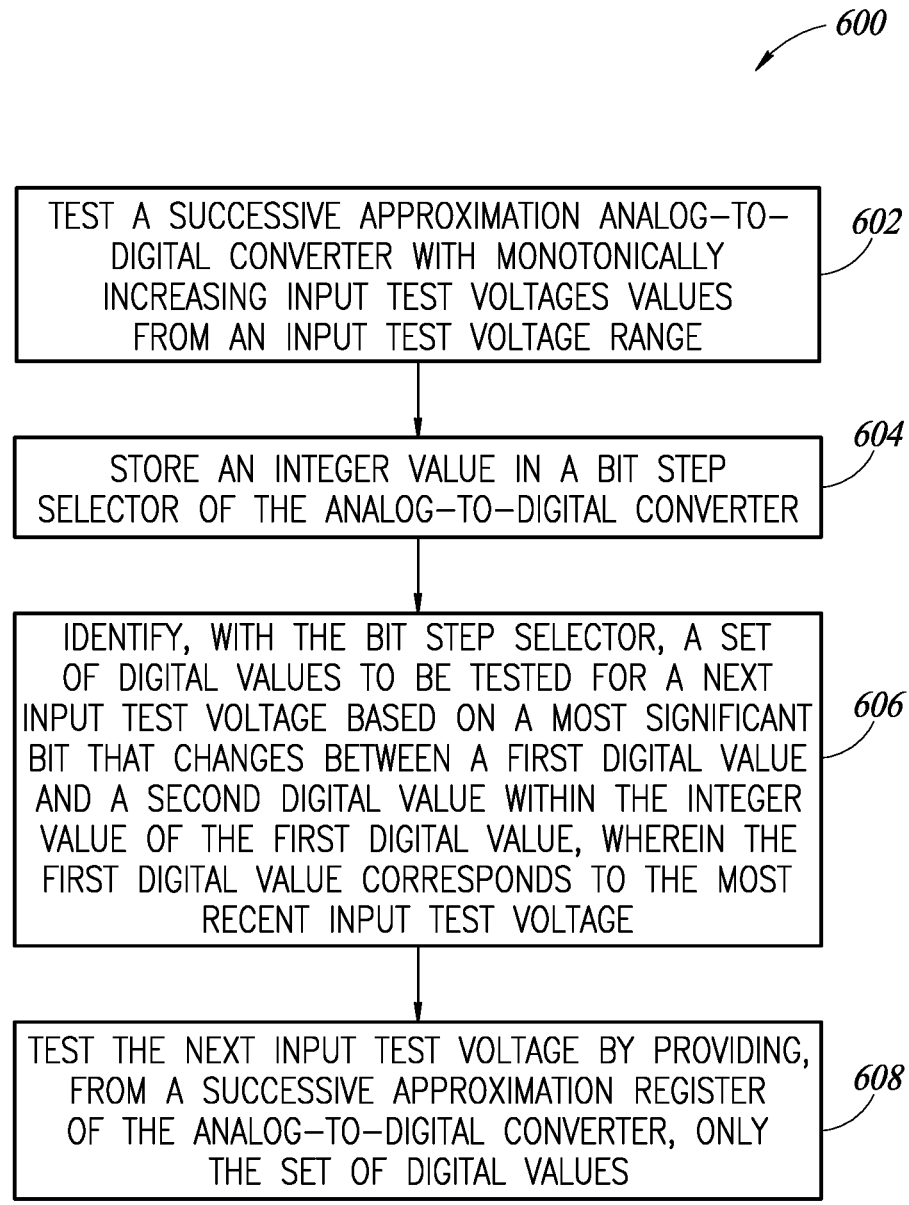
FIG. 6 is a flow diagram of a process for testing an analog-to-digital converter, according to one embodiment.

FIG. 6 is a flowchart of a method 600 for testing an ADC, according to one embodiment. At 602, the method 600 includes testing a successive approximation analog-to-digital converter with monotonically increasing input test voltages from an input test voltage range. At 604, the method 600 includes storing an integer value in a bit step selector of the analog-to-digital converter. At 606, the method 600 includes identifying, with the bit step selector, a set of digital values to be tested for a next input test voltage based on a most significant bit that changes from a first digital value to a second digital value within the integer value of the first digital value, wherein the first digital value corresponds to a most recent input test voltage. At 608, the method 600 includes testing, the next input voltage by providing, from a successive approximation register of the analog-to-digital converter only those digital values within the set of digital values.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
testing an analog-to-digital converter with a plurality of monotonically increasing input test voltages in an input test voltage range;
storing an integer value in a bit step selector of the analog-to-digital converter;
identifying, with the analog-to-digital converter during testing, a first digital value corresponding to a most recent input test voltage;
identifying a most significant bit that changes between the first digital value and a second digital value within the integer value from the first digital value; and
testing a next input test voltage in the input test voltage range by adjusting only those bits of the first digital value having a significance equal to or less than the most significant bit that changes between the first digital value and the second digital value.

2. The method of claim 1, wherein identifying the most significant bit that changes includes performing an XOR operation on the first digital value and the second digital value.

3. The method of claim 1, wherein identifying the most significant bit that changes includes performing an XOR operation on the second digital value and a third digital value, wherein the second digital value is the integer value ahead of the first digital value, wherein the third digital value is the integer value behind the first digital value.

4. The method of claim 1, wherein the analog-to-digital converter is a successive approximation register analog-to-digital converter.

5. The method of claim 1, further comprising identifying the most significant bit that changes with the bit step selector.

6. The method of claim 5, further comprising testing the next input voltage with a successive approximation register coupled to the bit step selector.

7. A method, comprising:
testing a successive approximation analog-to-digital converter with monotonically increasing input test voltages from an input test voltage range;
storing an integer value in a bit step selector of the analog-to-digital converter;
identifying, with the bit step selector, a set of digital values to be tested for a next input test voltage based on a most significant bit that changes between a first digital value to a second digital value within the integer value of the first digital value, wherein the first digital value corresponds to a most recent input test voltage; and
testing the next input test voltage by providing, from a successive approximation register of the analog-to-digital converter only the set of digital values.

8. The method of claim 7, further comprising identifying the most significant bit that changes with the bit step selector by enabling the bit step selector during testing of the analog-to-digital converter.

9. The method of claim 8, wherein identifying the most significant bit includes performing an XOR operation on the first digital value and the second digital value.

10. The method of claim 8, wherein identifying the most significant bit includes performing an XOR operation on the second digital value and a third digital value, wherein the second digital value is the integer value ahead of the first digital value, wherein the third digital value is the integer value behind the first digital value.

11. The method of claim 7, further comprising receiving the integer value from a circuit external to the analog-to-digital converter.

12. An integrated circuit comprising an analog-to-digital converter, the analog-to-digital converter including:
a successive approximation register configured to output digital values each including a plurality of bits;
a digital-to-analog converter coupled to the successive approximation register and configured to receive the digital values and to generate analog output voltages representing the digital values;
a comparator coupled to the digital-to-analog converter and configured to compare, during testing, the analog output voltages to analog test voltages; and
a bit step selector coupled to the successive approximation register and configured to store an integer value, to identify a most recent digital value corresponding to a most recent analog test voltage and to select a number of bits to be tested by the successive approximation register for a next analog test voltage based on a first digital value and a second digital value within the integer value of the first digital value, wherein the first digital value corresponds to a most recent analog test voltage.

13. The integrated circuit of claim 12, wherein the bit step selector includes a logic circuit configured to select the number of bits based on the integer value and the first digital value.

14. The integrated circuit of claim 13, wherein the logic circuit includes an XOR operator configured to perform an XOR operation on two or more digital values.

15. The integrated circuit of claim 14, wherein the bit step selector is configured to select the number of bits to be tested based on the XOR operation.

16. The integrated circuit of claim 14, wherein XOR operator performs the XOR operation on the second digital value and a third digital value, wherein the third digital value is the integer value behind the first digital value, wherein the second digital value is the integer value ahead of the first digital value.

17. The integrated circuit of claim 12, wherein the bit step selector is configured to receive the integer value from a user of the analog-to-digital converter.

18. The integrated circuit of claim 12, wherein the bit step selector is configured to receive the integer value from a circuit external to the analog-to-digital converter.

19. The integrated circuit of claim 12, wherein the analog-to-digital converter is configured to operate in a standard operational mode and a testing mode, wherein the bit step selector only selects the number of bits during the testing mode.

20. The integrated circuit of claim 19, wherein in the standard operational mode the comparator receives analog input voltages and the successive approximation register tests all bits for each analog input voltage.

* * * * *